US 8,410,803 B2

(12) United States Patent
Sawa et al.

(10) Patent No.: US 8,410,803 B2
(45) Date of Patent: Apr. 2, 2013

(54) TEST APPARATUS OF SEMICONDUCTOR DEVICE AND METHOD THEREOF

(75) Inventors: Nobuhiro Sawa, Ohtsu (JP); Kouichi Minami, Ohtsu (JP); Masato Chiba, Kuroishi (JP)

(73) Assignees: Renesas Electronics Corporation, Kanagawa (JP); Kabushiki Kaisha Nihon Micronics, Tokyo (JP)

( * ) Notice: Subject to any disclaimer, the term of this patent is extended or adjusted under 35 U.S.C. 154(b) by 269 days.

(21) Appl. No.: 12/820,623

(22) Filed: Jun. 22, 2010

(65) Prior Publication Data

US 2011/0018569 A1    Jan. 27, 2011

(30) Foreign Application Priority Data

Jul. 23, 2009   (JP) ................................. 2009-171823

(51) Int. Cl.
*G01R 31/00* (2006.01)
*G01R 31/20* (2006.01)
(52) U.S. Cl. ............................. 324/750.16; 324/757.01
(58) Field of Classification Search ............. 324/750.16, 324/757.01
See application file for complete search history.

(56) References Cited

U.S. PATENT DOCUMENTS

| 5,644,245 | A | * | 7/1997 | Saitoh et al. | 324/750.18 |
|---|---|---|---|---|---|
| 5,648,728 | A | * | 7/1997 | Canella | 324/750.03 |
| 6,111,421 | A | * | 8/2000 | Takahashi et al. | 324/750.04 |
| 7,701,236 | B2 | * | 4/2010 | Akiyama et al. | 324/750.16 |
| 7,710,135 | B2 | * | 5/2010 | Ishii | 324/756.03 |
| 7,724,007 | B2 | * | 5/2010 | Yamamoto et al. | 324/762.05 |
| 7,777,510 | B2 | * | 8/2010 | Matsuzawa | 324/762.05 |
| 7,940,065 | B2 | * | 5/2011 | Yano et al. | 324/750.16 |
| 8,130,004 | B2 | * | 3/2012 | Yamada et al. | 324/750.16 |
| 8,311,758 | B2 | * | 11/2012 | Casler et al. | 702/94 |
| 8,319,510 | B2 | * | 11/2012 | Ogino et al. | 324/750.16 |
| 2007/0124932 | A1 | * | 6/2007 | Hosaka et al. | 29/874 |
| 2008/0290886 | A1 | * | 11/2008 | Akiyama et al. | 324/758 |
| 2009/0085594 | A1 | * | 4/2009 | Yamamoto et al. | 324/758 |
| 2010/0219854 | A1 | * | 9/2010 | Kuniyoshi et al. | 324/758 |

FOREIGN PATENT DOCUMENTS

| JP | 2-65150 A | 3/1990 |
|---|---|---|
| JP | 6-62380 U | 9/1994 |
| JP | 7-37946 A | 2/1995 |
| JP | 2002-181889 A | 6/2002 |
| KR | 2003-0092914 A | 12/2003 |
| KR | 10-2005-0114215 A | 12/2005 |

OTHER PUBLICATIONS

Japanese Office Action mailed Dec. 18, 2012 for corresponding Japanese patent application No. 2009-171823.

* cited by examiner

*Primary Examiner* — Joshua Benitez Rosario
(74) *Attorney, Agent, or Firm* — Sughrue Mion, PLLC

(57) ABSTRACT

A test apparatus according to the present invention includes a probe card recognition unit that recognizes positions of at least two probe card marks formed to a probe card and assumes a probe card mark connection line connecting the positions of the probe card marks, a backing material recognition unit that recognizes positions of at least two backing material marks formed to a backing material where a semiconductor chip is fixed thereto and assumes a backing material mark connection line connecting the positions of the backing material mark, a positional relationship recognition unit that recognizes a positional relationship between the probe card and the backing material according to the probe card mark connection line and the backing material mark connection line, and a correction unit that corrects the position of at least one of the probe card and the backing material according to the positional relationship.

8 Claims, 11 Drawing Sheets

SUCCESSFUL EXAMPLE          UNSUCCESSFUL EXAMPLE

TEST APPARATUS OF SEMICONDUCTOR DEVICE AND METHOD THEREOF

INCORPORATION BY REFERENCE

This application is based upon and claims the benefit of priority from Japanese patent application No. 2009-171823, filed on Jul. 23, 2009, the disclosure of which is incorporated herein in its entirety by reference.

BACKGROUND

1. Field of the Invention

The present invention relates to an apparatus and a method for testing a semiconductor device using a probe card, and particularly to positioning of the probe card.

2. Description of Related Art

The probe card has been used for the performance test of various semiconductor devices, such as a central processing unit and a memory. The probe card is provided with multiple probes, which are needle-like conductors. In the case of a test, the probe card must be accurately positioned so that these probes are connected to a semiconductor chip to be tested and predetermined input and output terminals of a package provided with the semiconductor chip. However, such positioning operation is becoming difficult along with the reduction of chip size, the increase in the number of terminals, and the spread of TAB (Tape Automated Bonding) technology, for example.

FIG. 10 illustrates the configuration of a test apparatus 101 according to a related art. A TAB tape 110 winds around a supply reel 111. A semiconductor chip to be tested is fixed (connected) to the TAB tape 110. The TAB tape 110 is fed out from the supply reel 111 in the direction indicated by the arrow so that the conductor pattern (electrode pad) is located at the bottom of the drawing, and supplied to a measurement point 113. An imaging apparatus 112 is placed at the measurement point 113. At the measurement point 113, the TAB tape 110 is absorbed and retained from above by a pressure plate 115. Then as illustrated in FIG. 11, the probes 121 of the probe card extending from bottom contact electrode pads 126 which are connected to input and output terminals of the semiconductor chip 125. At this time, the probes 121 and the electrode pads 126 are positioned by the method performed by a test worker to manipulate a suitable operation unit and displace the probe card while checking the video of the measurement point 113 displayed on a display.

FIG. 12 illustrates the shape of a tip of a common probe 121. As illustrated in FIG. 12, the tip of the probe 121 bends toward the electrode pad 126 in order to form a favorable contact with the electrode pad 126. Therefore, a slight up and down of the probe 121, and shallow depth of field of the imaging apparatus 112 can easily create variation in the position recognition of the tip of the probe 121. FIG. 13 illustrates a successful and an unsuccessful examples of the position recognition of the tips of the probes 121. If the positions of the tips of the probes 121 can be correctly recognized, each of the tip positions can be on one straight line 130. On the other hand, if the tip positions of the probes 121 cannot be correctly recognized, each of the tip positions cannot be on the straight line, as illustrated in the unsuccessful example of FIG. 13.

Japanese Unexamined Patent Application Publication No. 2002-181889 discloses a technique relating to the positioning of the probe card and the TAB tape in a test apparatus as the one explained above. FIG. 14 is cited from Japanese Unexamined Patent Application Publication No. 2002-181889 and illustrates the method to recognize the positional relationship between the probe card and the TAB tape. This technique adjusts an angle θ to be 0. The angle θ is determined by a straight line X connecting a certain probe 2A1 and a probe 2A2, which is the farthest probe from the probe 2A1, and a straight line Y connecting the electrode pads 1C1 and 1C2. Note that the probes 2A1 and 2A2 are to have contact with the electrode pads 1C1 and 1C2.

Further, Japanese Unexamined Patent Application Publication No. 2-65150 discloses the technique relating to the positioning of a chip in a wafer and a probe card. The technique disclosed in Japanese Unexamined Patent Application Publication No. 2-65150 forms multiple marks on the straight line passing through the center of a circular probe card, recognizes the positions of the marks by an imaging apparatus placed on a stage where the chip to be tested is mounted thereto, and displaces the chip on the stage according to the result of the recognition.

SUMMARY

As described above, in Japanese Unexamined Patent Application Publication No. 2002-181889, the orientation (angle) of the probe card is determined according to the recognition result of the tip positions of the two probes. However, as explained with reference to FIGS. 12 and 13, the present inventors have found a problem that it is difficult by the image processing technique to recognize the positions of the tips of the probes 121 due to their shape. Therefore, the straight line X of FIG. 14, which is the orientation of the probe card, cannot be correctly recognized.

Further, in the technique disclosed in Japanese Unexamined Patent Application Publication No. 2-65150, there is no means to correctly recognize the position of the electrode pads over the wafer. Accordingly, this may disable highly accurate positioning operations.

An exemplary aspect of the present invention is a test apparatus of a semiconductor device that includes a probe card recognition unit that recognizes positions of at least two probe card marks and assumes a probe card mark connection line, in which the probe card marks are formed to a probe card, and the probe card mark connection line connects the positions of the probe card marks, a backing material recognition unit that recognizes positions of at least two backing material marks, and assumes a backing material mark connection line, the backing material marks are formed to a backing material where a semiconductor chip is fixed thereto, and the backing material mark connection line connects the positions of the backing material mark, a positional relationship recognition unit that recognizes a positional relationship between the probe card and the backing material according to the probe card mark connection line and the backing material mark connection line, and a correction unit that corrects the position of at least one of the probe card and the backing material according to the positional relationship.

According to the abovementioned aspect, the positions of the probe card marks formed to the probe card can be connected to assume the probe card mark connection line. That is, the orientation of the probe card is recognized according to the position recognition of the probe card marks, and not dependent on the position recognition of the tip of the probe. Further, the orientation of the backing material can be recognized according to the backing material mark connection line connecting the positions of the backing material marks, which are formed to the backing materials such as TAB tape and a wafer. Then, the positional relationship between the probe card and the backing material is recognized according to the relationship between the probe card mark connection line and the backing material mark connection line, and the positional relationship is corrected according to the result of the recognition.

Another exemplary aspect of the present invention is a method of testing a semiconductor device that includes recognizing positions of at least two probe card marks, in which the probe card marks are formed to a probe card, assuming a probe card mark connection line, in which the probe card mark connection line connects the positions of the probe card marks, recognizing positions of at least two backing material marks, in which the backing material marks are formed to a backing material, assuming a backing material mark connection line, in which the backing material mark connection line connects the positions of the backing material marks, recognizing a positional relationship between the probe card and the backing material according to the probe card mark connection line and the backing material mark connection line, and correcting the position of at least one of the probe card and the backing material according to the positional relationship.

The exemplary aspects of the method are based on the same technical concept as the exemplary aspect of the above apparatus.

The present invention enables to recognize the positional relationship between the probe card and the backing material without the position recognition of the tip of the probe. This achieves the positioning operation with extremely high accuracy.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
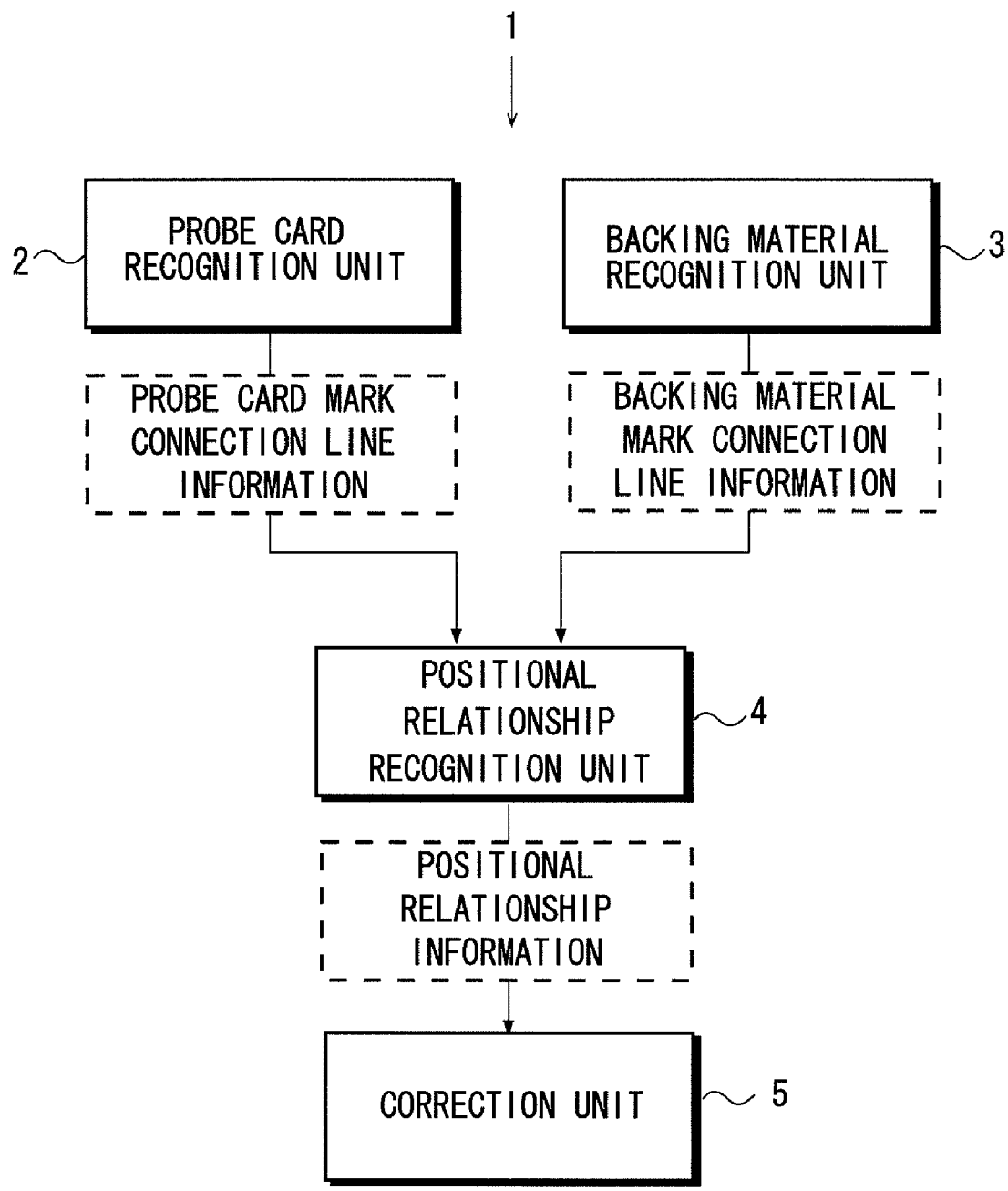
FIG. 1 is a block diagram illustrating the functional configuration of a test apparatus of a semiconductor device according to a first exemplary embodiment of the present invention.
Figure 2:
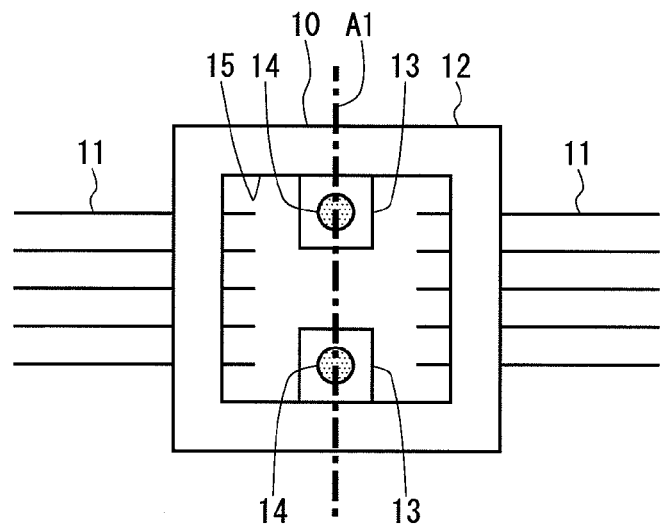
FIG. 2 exemplifies the configuration of a probe card used in the test apparatus of the semiconductor device according to the first exemplary embodiment of the present invention.
Figure 3:
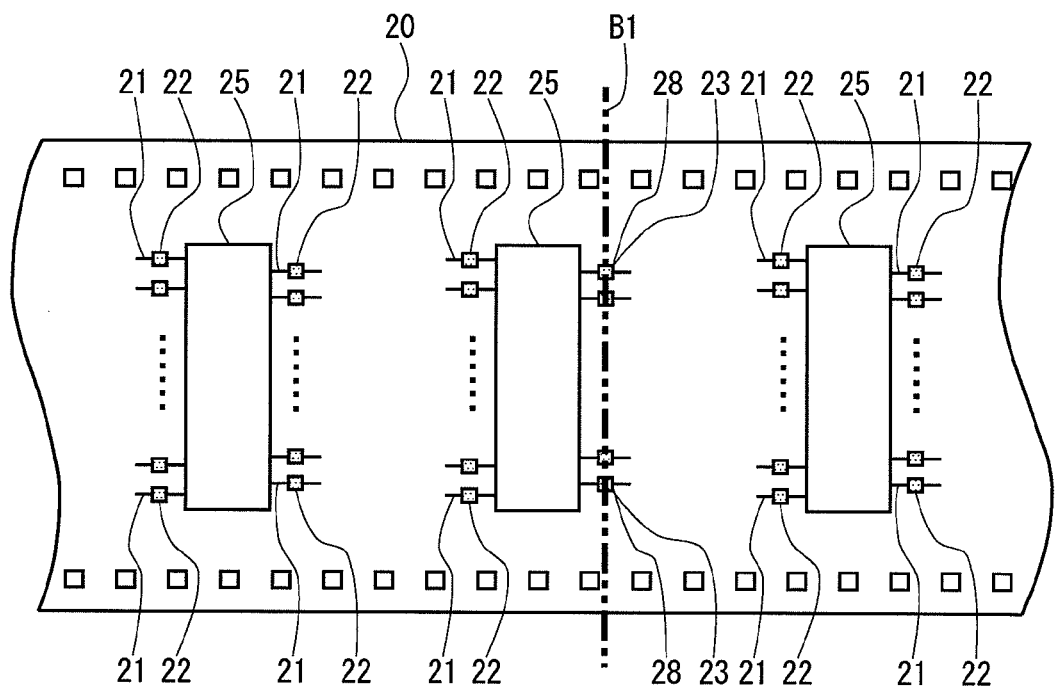
FIG. 3 exemplifies the configuration of a backing material (TAB tape) used in the test apparatus of the semiconductor device according to the first exemplary embodiment of the present invention.

FIG. 1 illustrates the functional configuration of a test apparatus of a semiconductor device (hereinafter abbreviated as a test apparatus) according to the first exemplary embodiment of the present invention. The test apparatus 1 is provided with a probe card recognition unit 2, a backing material recognition unit 3, a positional relationship recognition unit 4, and a correction unit 5. Further, FIG. 2 illustrates the configuration of a probe card 10 used in the test apparatus 1. FIG. 3 illustrates the configuration of a TAB tape (backing material) 20 used in the test apparatus 1.

The probe card recognition unit 2 recognizes the positions of at least two of probe card marks 14 formed to the probe card 10, and assumes a probe card mark connection line A1 which connects the positions of these probe card marks 14. The probe card recognition unit 2 can be composed of a combination of an imaging apparatus, a microcomputer, an image analysis program, and various operation programs, for example.

The backing material recognition unit 3 recognizes the positions of at least two backing material marks 28, and then assumes a backing material mark connection line B1 which connects the positions of these backing material marks 28. The backing material marks 28 here are formed to the backing material (TAB tape) 20 where a semiconductor chip 25 to be tested is fixed thereto. As with the probe card recognition unit 2, the backing material recognition unit 3 can be composed of a combination of an imaging apparatus, a microcomputer, an image analysis program, and various operation programs, for example.

The positional relationship recognition unit 4 recognizes the positional relationship between the probe card 10 and the backing material 20 according to the probe card mark connection line A1 and the backing material mark connection line B1. The positional relationship recognition unit 4 can be composed of a combination of a microcomputer and various operation programs, for example.

Figure 4:
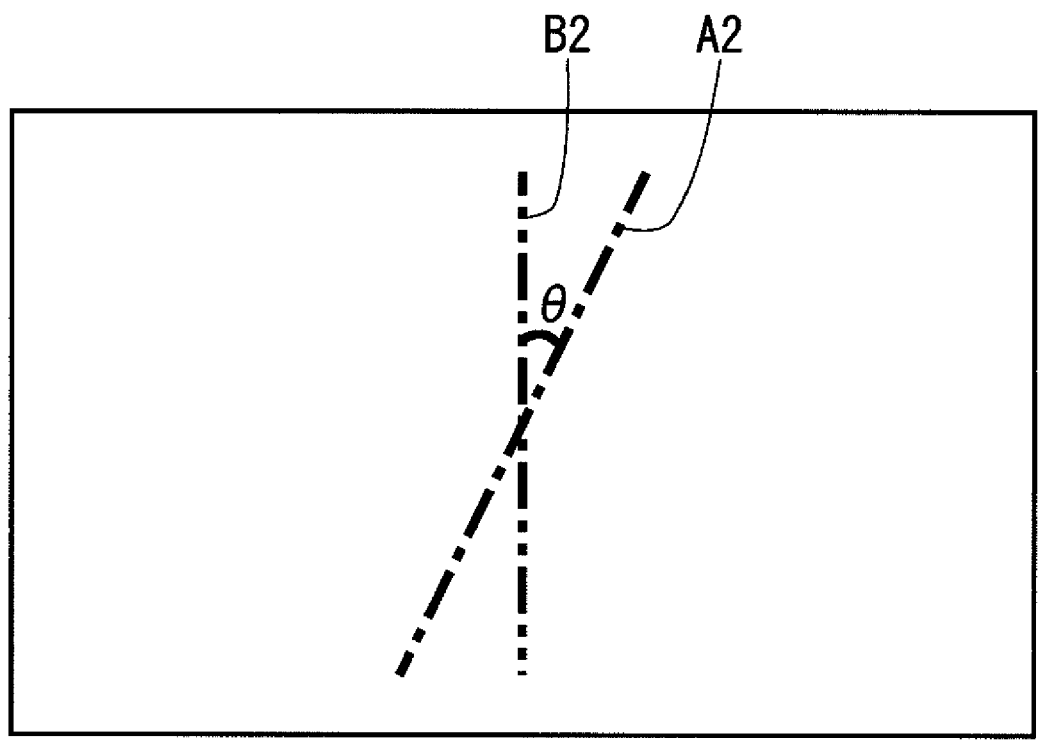
FIG. 4 exemplifies a display screen of a display unit according to the first exemplary embodiment.

Moreover, the positional relationship recognition unit 4 may be provided with a display unit which enables a test operator to visually recognize the positional relationship. FIG. 4 illustrates the display screen of the display unit. As illustrated in FIG. 4, it is preferable that the display unit enables to visually compare a probe card orientation line A2 and a backing material orientation line B2. The probe card orientation line A2 corresponds to the probe card mark connection line A1 (see FIG. 2) and indicates the orientation of the probe card 10. The backing material orientation line B2 corresponds to the backing material mark connection line B1 (see FIG. 3) and indicates the orientation of the backing material 20. The display unit may be composed of a combination of a display, a microcomputer, and an image processing program, for example.

The correction unit 5 corrects the position of at least one of the probe card 10 and the backing material 20 according to the positional relationship between the probe card 10 and the backing material 20, which is recognized by the positional relationship recognition unit 4. The correction by the correction unit can be performed manually or automatically. The manual correction unit 5 may be composed of a combination of, for example, the display unit, an operation unit for receiving user operations, a conversion unit for converting the operation supplied to the operation unit into electrical signals, an electronic control unit (including a microcomputer and various operation programs) for analyzing the electrical signals from the conversion unit and providing a predetermined command signal, and a driving unit for displacing the probe card 10 or the backing material 20 in response to the command signal received from the electric control unit. The automatic correction unit 5 will not require the display unit, the operation unit, the conversion unit or the like, and may use operation and control programs for automatically controlling the driving unit according to signals relating to the positional relationship recognized by the positional relationship recognition unit 4.

As illustrated in FIG. 2, the probe card 10 according to the first exemplary embodiment is provided with probes 11, a frame 12, projected parts 13, and probe card marks 14.

The frame 12 is a part of the body part which fixes one terminal side (the side where the test apparatus is connected thereto) of the multiple probes 11, which are needle-like conductors, to the frame 12. There is an opening 15 in the center of the frame 12. Note that in the first exemplary embodiment, the shape of the frame 12 is rectangle, however the present invention is not limited to this, but may be polygonal or circular shape, for example.

The projected part 13 is placed in the opening 15. The projected part 13 projects from the inner wall toward the center of the frame 12. Two projected parts 13 are formed in the first exemplary embodiment.

The probe card marks 14 are formed to each of the projected parts 13. The shape, material, and color or the like of the probe card marks 14 should be recognizable in the image recognition process using the imaging apparatus. Preferable forms of the probe card mark 14 are a hole formed in the projected part 13, a printing pattern with different reflectance from its surrounding, an uneven shape, and a rough surface, for example. Although the probe card marks 14 are formed to the projected parts 13 in the first exemplary embodiment, the present invention is not limited to this. The probe card mark 14 may be formed to a different place other than the projected part 13 as long as the probe card mark connection line A1 can be assumed. By devising the shape or the like of the projected part 13, the projected part 13 itself can be used as the probe card mark 14.

As illustrated in FIG. 3, conductor patterns 21 and electrode pads 22 are formed to the TAB tape 20, which is the backing material. The semiconductor chips 25 to be tested are fixed to the TAB tape 20. Input and output terminals of the semiconductor chip 25 are connected to the electrode pads 22 by each of the conductor patterns 21. These conductor patterns 21 may extend outside the electrode pads 22. In this exemplary embodiment, at least two of the electrode pads 22 are used as backing material marks 28. Some of the electrode pads 22 are electrode pads for test 23 used to test the semiconductor chip 25. It is preferable to use these electrode pads 23 for test as the backing material marks 28.

Figure 5:
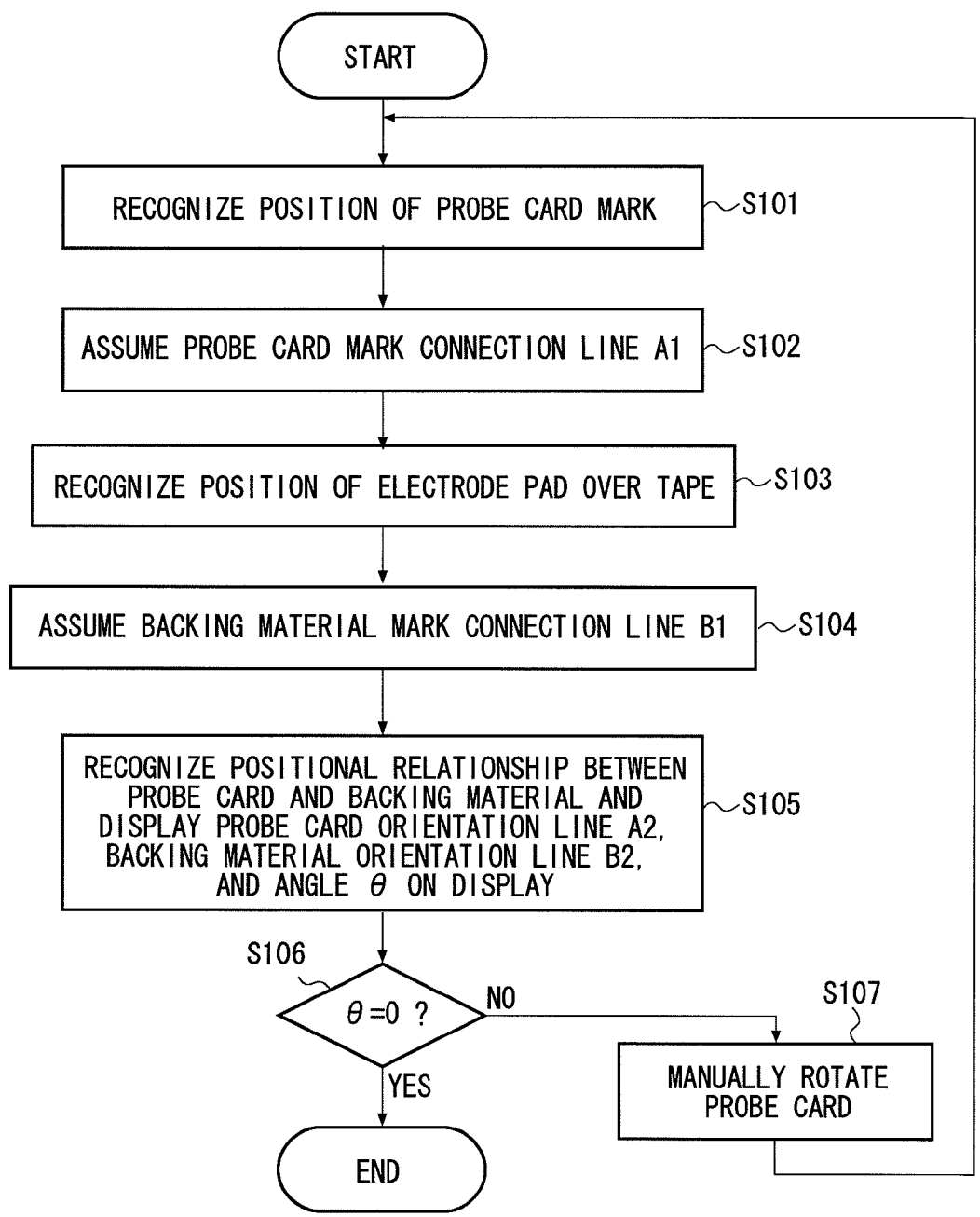
FIG. 5 is a flowchart illustrating a manual positioning process of the probe card according to the first exemplary embodiment.

FIG. 5 illustrates the manual positioning process of the probe card 10 according to the first exemplary embodiment. First, the probe card recognition unit 2, which is provided with the imaging apparatus and so on, recognizes the probe card marks 14 formed to the probe card 10 (S101), and assumes the probe card mark connection line A1 (S102). Further, the backing material recognition unit 3, which is provided with the imaging apparatus and so on, recognizes the backing material marks 28 (the electrode pads for test 23) formed to the backing material (TAB tape) 20 (S103), and assumes the backing material mark connection line B1 (S104).

Next, the positional relationship recognition unit 4 recognizes the positional relationship between the probe card 10 and the backing material 20 according to the probe card mark connection line A1 and the backing material mark connection line B1. Then, as illustrated in FIG. 4, the positional relationship recognition unit 4 displays the probe card orientation line A2 indicating the orientation of the probe card 10, the backing material orientation line B2 indicating the orientation of the backing material 20, and the angle θ on the display (S105). Note that the angle θ is determined by the orientation lines A2 and B2. At this time, the probe card mark connection line A1 and the probe card orientation line A2 may be the same. Moreover, the backing material mark connection line B1 and the backing material orientation line B2 may be the same.

Then, the test operator can check whether θ=0 by looking at the display (S106). If θ=0 (YES), this process is ended. If θ is not 0 (NO), the correction unit 5 including the operation unit and so on rotates the probe card 10 to make θ=0 (S107). After that, the step S101 is carried out again. This process enables to manually optimize the positional relationship between the probe card 10 and the backing material 20.

Figure 6:
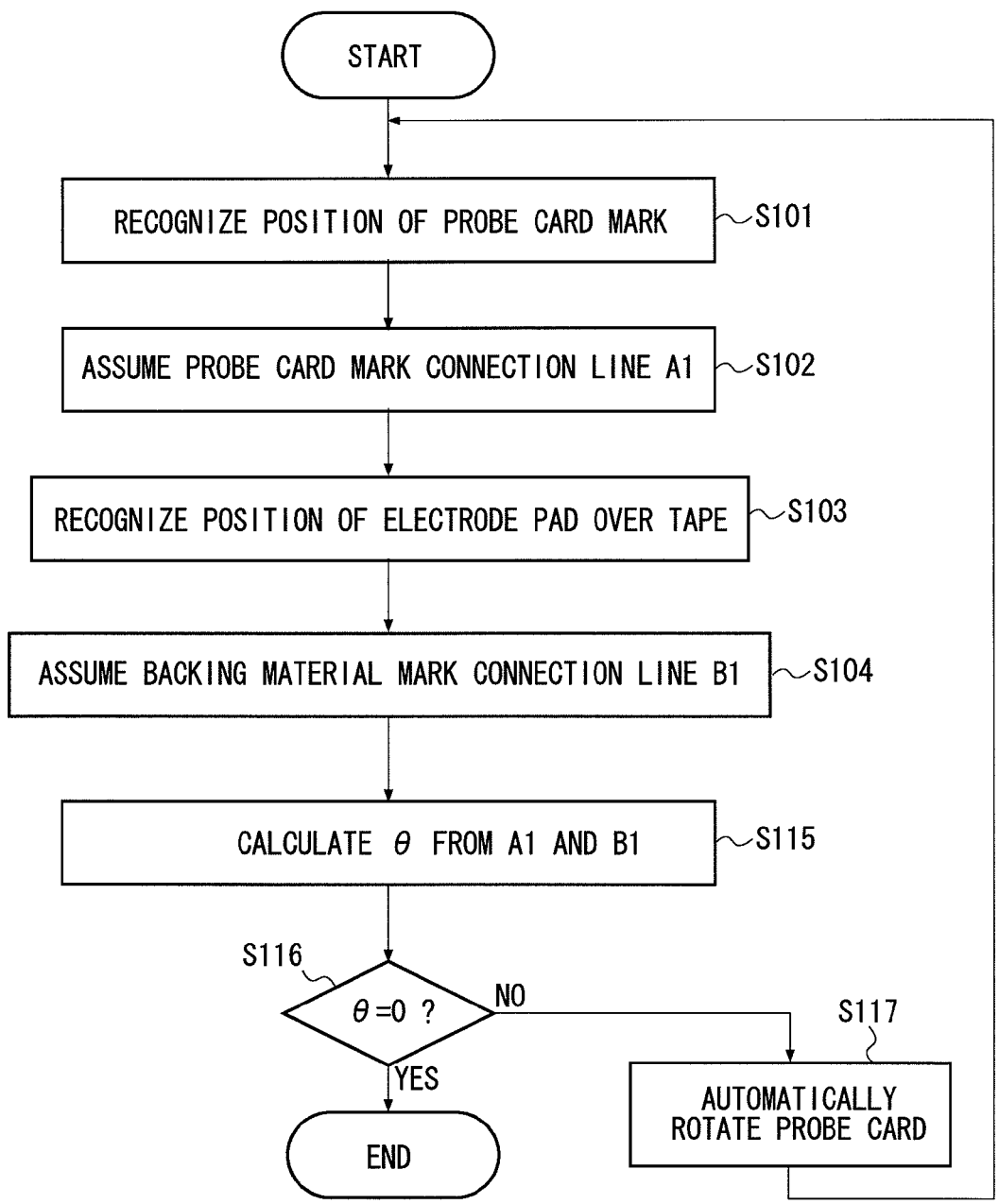
FIG. 6 is a flowchart illustrating an automatic positioning process of the probe card according to the first exemplary embodiment.

FIG. 6 illustrates the automatic positioning process of the probe card 10 according to the first exemplary embodiment. In this process, the steps S105 to S107 in the manual process illustrated in FIG. 5 are modified to the steps S115 to S117.

This process calculates the angle θ based on the probe card mark connection line A1 and the backing material mark connection line B1 (S115). Then, θ is determined whether θ=0 (S116), and if θ=0 (YES), the process is ended. On the other hand, if θ is not zero (NO), the driving unit for rotating and moving the probe card 10 is controlled (S117). Then, the step S101 is carried out again. This process enables to automatically optimize the positional relationship between the probe card 10 and the backing material 20.

The first exemplary embodiment enables to recognize the positional relationship between the probe card 10 and the backing material 20 according to the probe card mark connection line A1 which connects the positions of the probe card marks 14, and the backing material mark connection line B1 which connects the positions of the backing material marks 28 (the electrode pad for test 23). As described so far, by using the line A1 connecting the positions of the probe marks 14, which enables easy image recognition, in order to recognize the orientation of the probe card 10, instead of using the tip of the probe 11, an accurate recognition result can be obtained. This enables to achieve accurate positioning process.

Second Exemplary Embodiment

Figure 7:
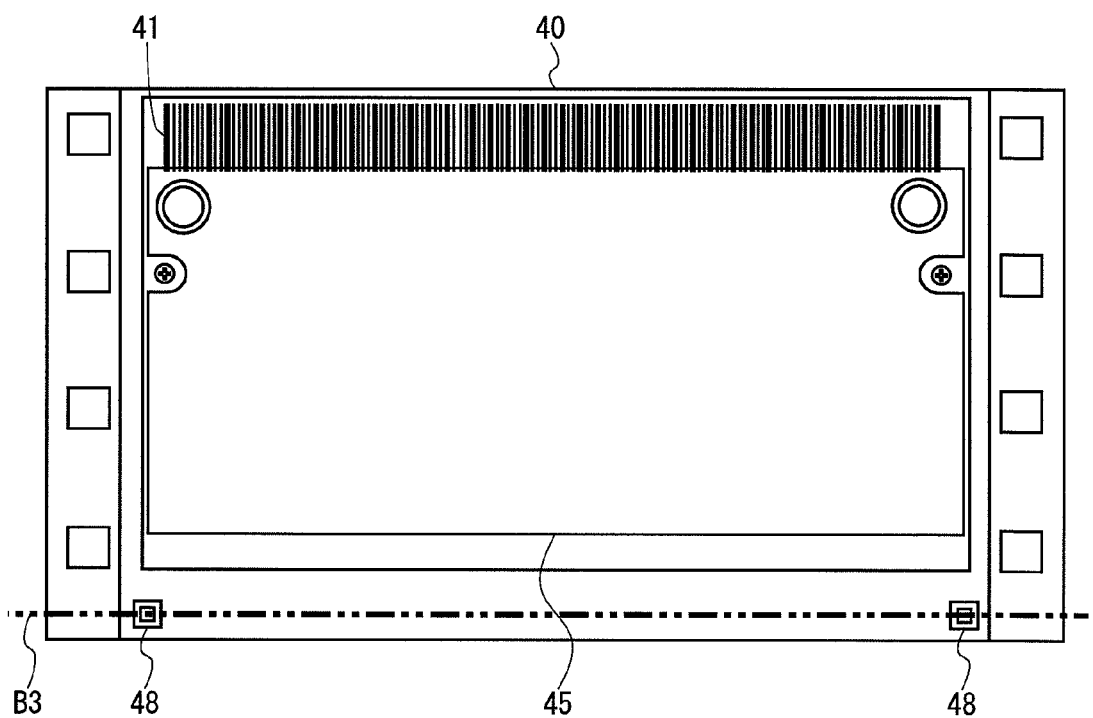
FIG. 7 exemplifies the configuration of a backing material used in a test apparatus of a semiconductor device according to a second exemplary embodiment of the present invention.

FIG. 7 illustrates the configuration of a backing material 40 used in the test apparatus according to a second exemplary embodiment of the present invention. As with the backing material 20 according to the first exemplary embodiment, in the backing material 40, a conductor pattern 41 is formed, a semiconductor chip 45 is fixed, and the conductor pattern 41 and input and output terminals of the semiconductor chip 45 are connected.

The difference from the backing material 20 according to the first exemplary embodiment is that the backing material 40 according to the second exemplary embodiment includes alignment marks 48. Two of the alignment marks 48 are formed to the place where the conductor pattern 41 is not formed in the backing material 40. Then, in the second exemplary embodiment, these alignment marks 48 are used as the backing material marks 28, and a line B3 connecting both of the alignment marks 48 is used as the backing material mark connection line B1.

Figure 8:
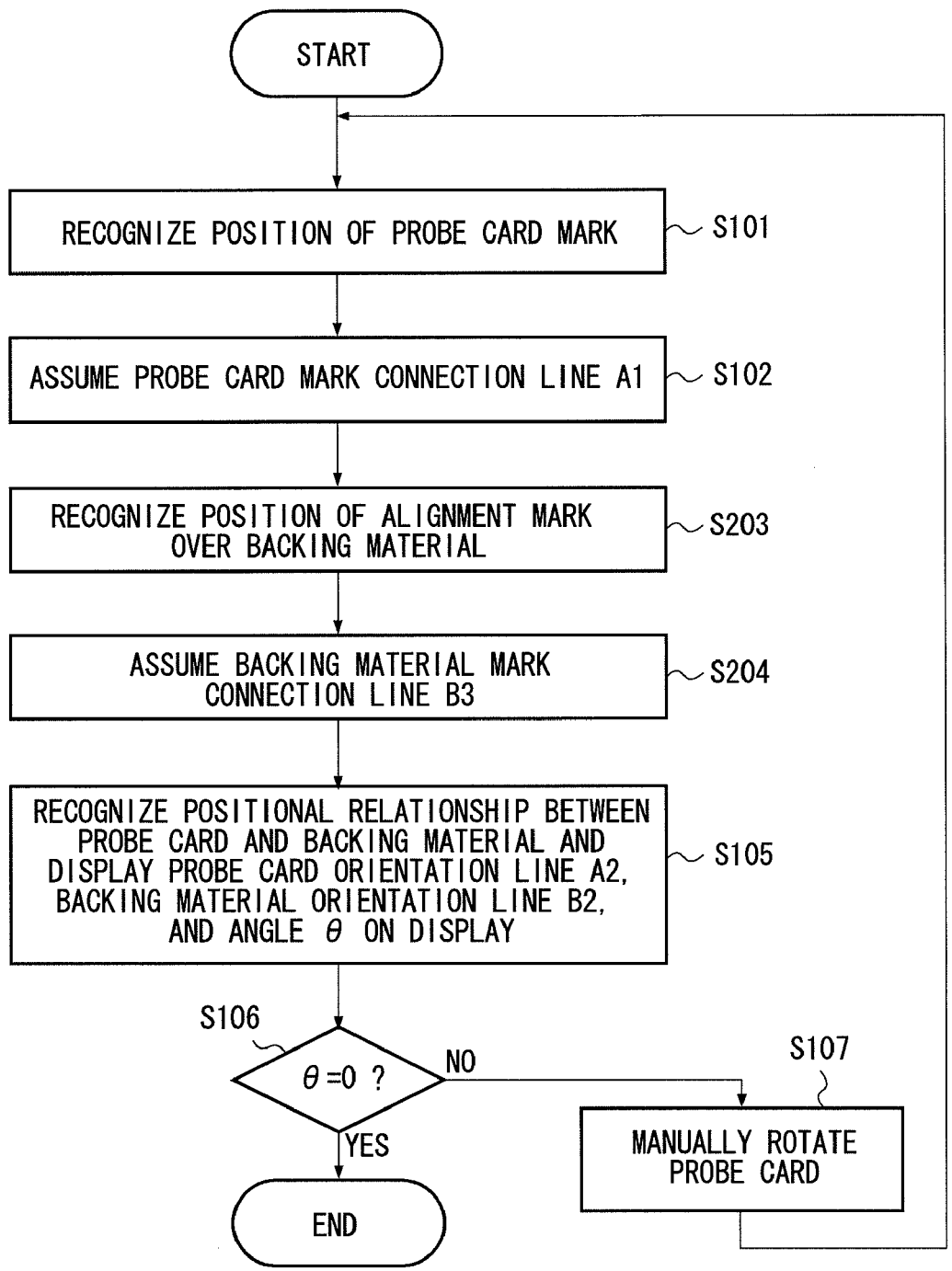
FIG. 8 is a flowchart illustrating a manual positioning process of a probe card according to the second exemplary embodiment.

FIG. 8 illustrates the manual positioning process of the probe card 10 according to the second exemplary embodiment. The difference from the process according to the first exemplary embodiment illustrated in FIG. 5 is that the process according to the second exemplary embodiment assumes the backing material mark connection line B3 according to the recognition of the alignment marks 48. This difference is illustrated by the steps S203 and S204.

Specifically, if the probe card marks 14 (see FIG. 2) are recognized in the steps S101 and S102, and the probe card mark connection line A1 is assumed, the alignment marks 48 formed over the backing material 40 are recognized, and the backing material mark connection line B3 is assumed, as illustrated in the steps S203 and 204. Then, as illustrated in the step S105, the positional relationship between the probe card 10 and the backing material 40 is recognized according to the probe card mark connection line A1 and the backing material mark connection line B3. Subsequently, the probe card orientation line A2, the backing material orientation line B2, and the angle θ is displayed on the display. Note that the angle θ is determined by the orientation lines A2 and B2. After that, as with the manual process according to the first exemplary embodiment (see FIG. 5), the test operator corrects the position of the probe card 10 to make θ=0.

Figure 9:
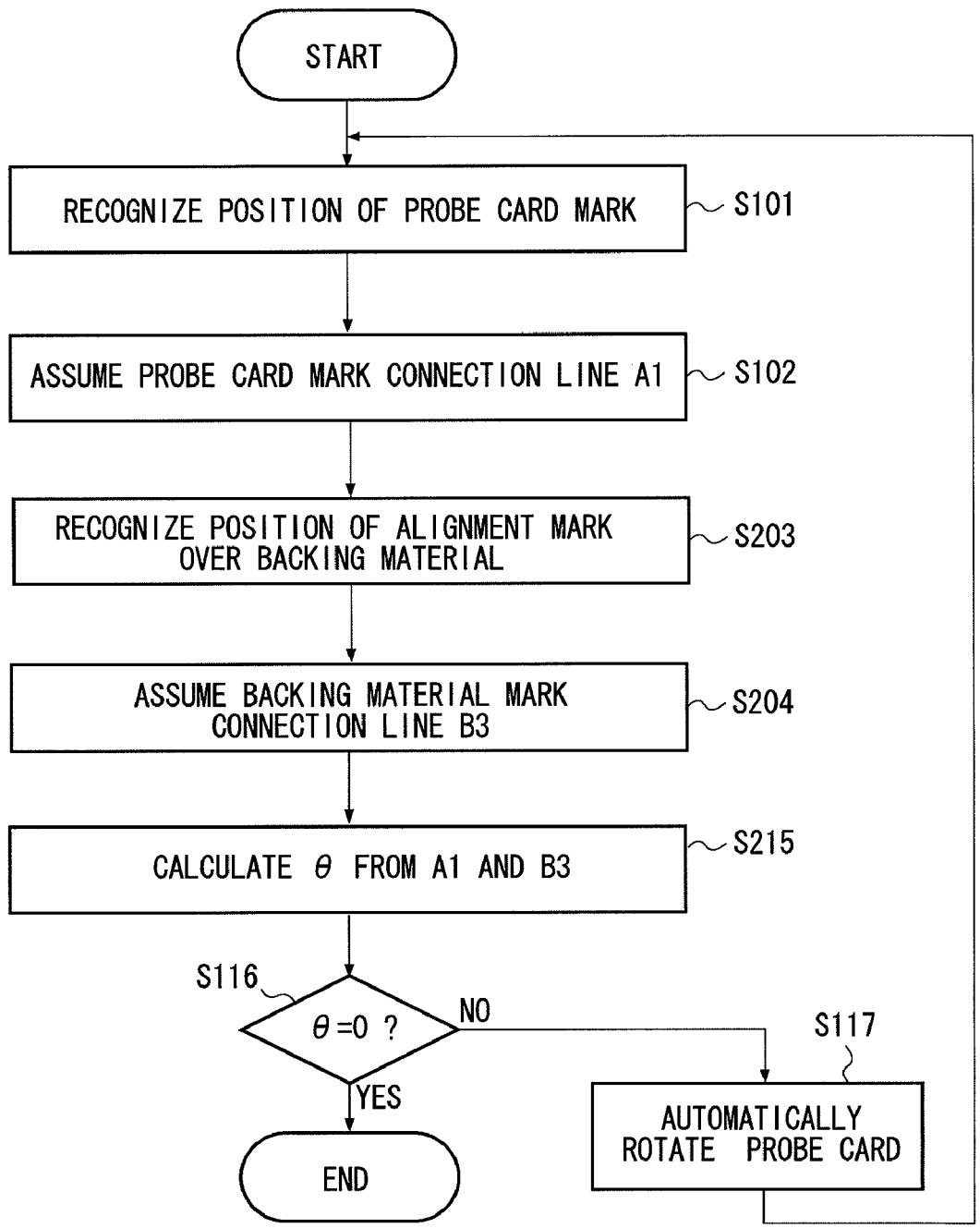
FIG. 9 is a flowchart illustrating an automatic positioning process of the probe card according to the second exemplary embodiment.
Figure 10:
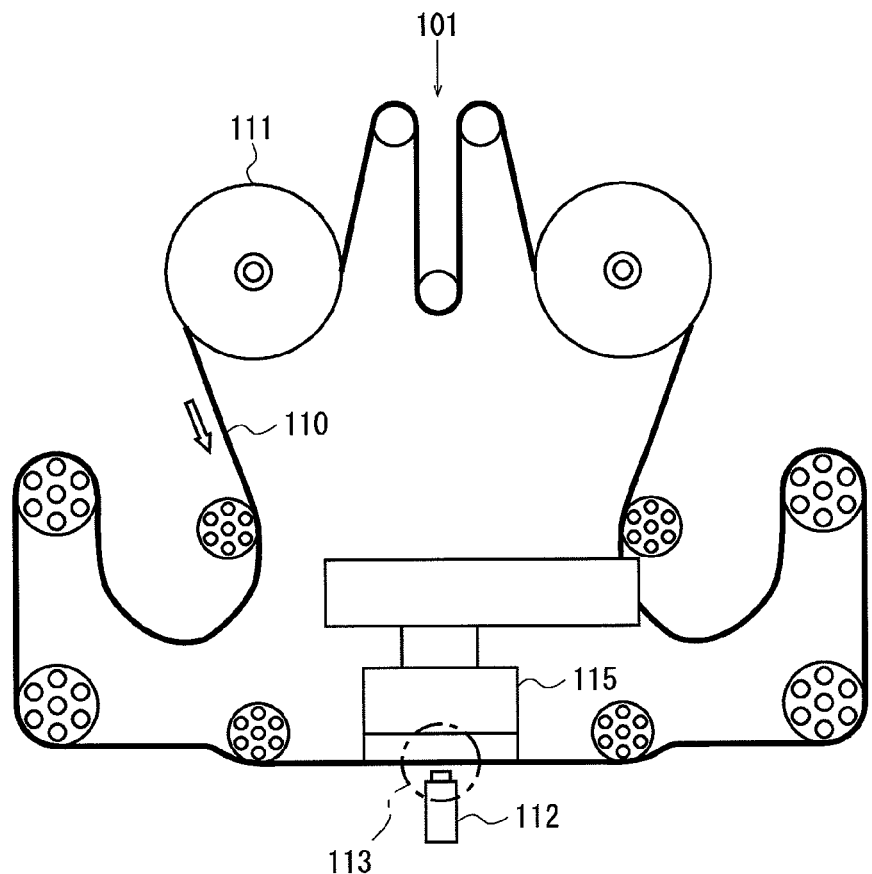
FIG. 10 exemplifies the configuration of a test apparatus of a semiconductor device according to a related art.
Figure 11:
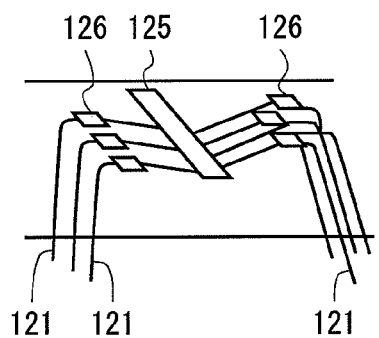
FIG. 11 illustrates the state of a measurement point in the test apparatus of the semiconductor device according to the related art.
Figure 12:
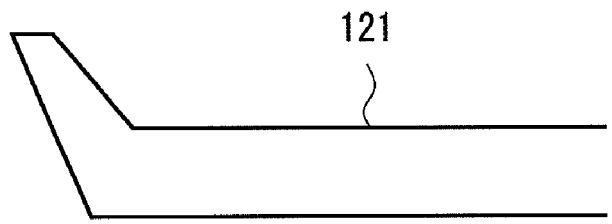
FIG. 12 exemplifies the shape of a tip of a common probe.
Figure 13:
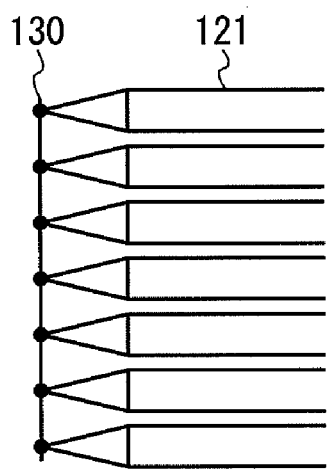
FIG. 13 exemplifies a successful and an unsuccessful examples of the position recognition of the tip of the probe.
Figure 13:
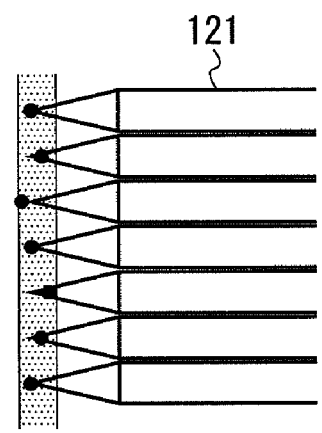
Figure 14:
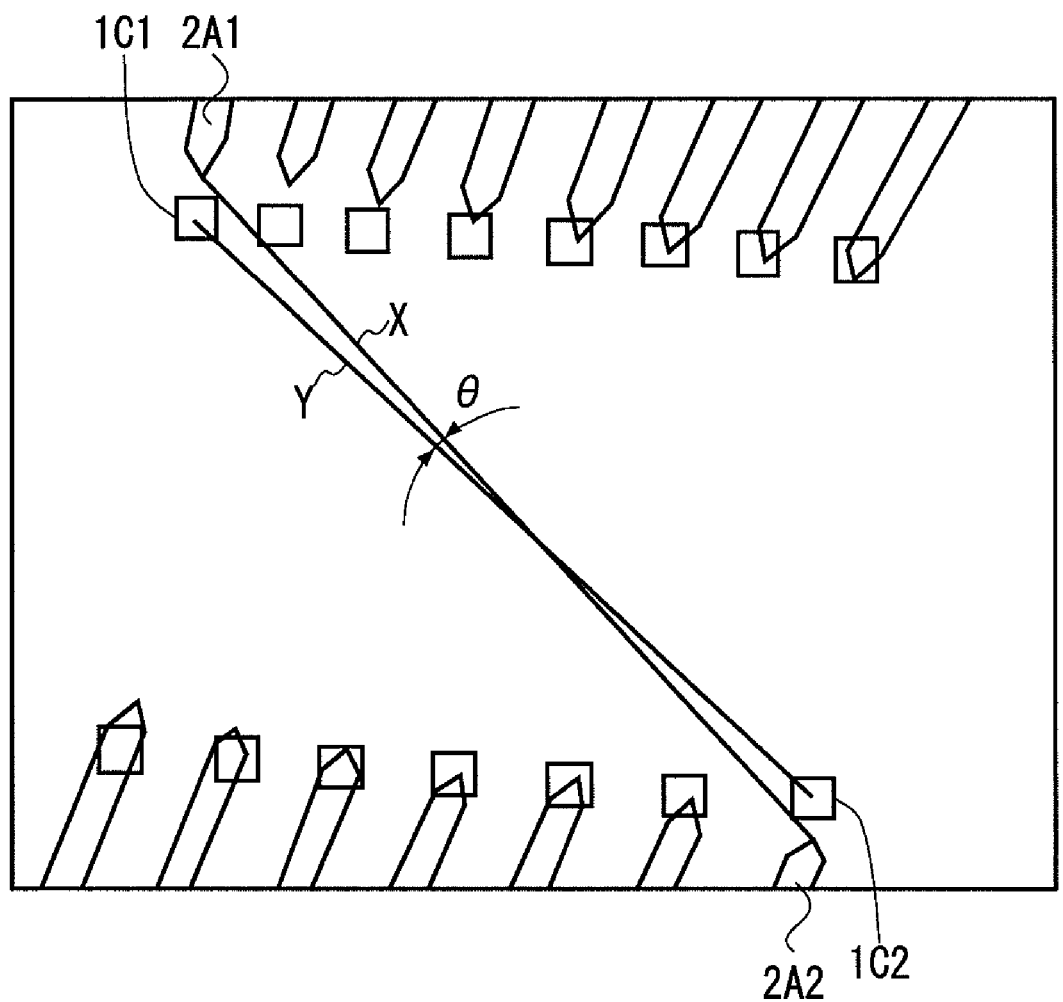
FIG. 14 illustrates a method to recognize the positional relationship between a probe card and a TAB tape according to a prior art.

FIG. 9 illustrates the automatic positioning process of the probe card 10 according to the second exemplary embodiment. In this process, the step S105 in the manual process illustrated on FIG. 8 is modified to the step S215.

In this process, the angle θ is calculated according to the probe card mark connection line A1 and the backing material mark connection line B3, which is assumed in the step S204 (S215). After that, as with the automatic process according to the first exemplary embodiment (see FIG. 6), the position of the probe card 10 is corrected to make θ=0.

In the second exemplary embodiment, the orientation of the backing material 40 is recognized according to the backing material mark connection line B3 connecting the positions of the alignment marks 48. The alignment marks 48 are formed to the place where the conductor pattern 41 is not formed, thus the alignment marks 48 are visually recognizable at any time and not obstructed by the members composing the probe card 10, such as the probes 11 and the frame 12. This enables to accurately recognize the state of the backing material 40 and eliminate the operations such as temporarily moving the probe card 10 in order to recognize the state of the backing material 40.

While the invention has been described in terms of several exemplary embodiments, those skilled in the art will recognize that the invention can be practiced with various modifications within the spirit and scope of the appended claims and the invention is not limited to the examples described above.

Further, the first and second exemplary embodiments can be combined as desirable by one of ordinary skill in the art.

Furthermore, the scope of the claims is not limited by the exemplary embodiments described above.

Furthermore, it is noted that, Applicant's intent is to encompass equivalents of all claim elements, even if amended later during prosecution.

What is claimed is:

1. A test apparatus of a semiconductor device comprising:
   a probe card recognition unit that recognizes positions of at least two probe card marks on a probe card, and the probe card recognition unit recognizes an imaginary probe card mark connection line formed by connecting the positions of the at least two probe card marks;
   a backing material recognition unit that recognizes positions of at least two backing material marks on a backing material mark, and the backing material recognition unit recognizes an imaginary backing material mark connection line formed by connecting the positions of the at least two backing material marks;
   a positional relationship recognition unit that recognizes a positional relationship between the probe card and the backing material according to the probe card mark connection line and the backing material mark connection line; and
   a correction unit that corrects the position of at least one of the probe card and the backing material according to the positional relationship.

2. The test apparatus of the semiconductor device according to claim 1, wherein the probe card mark is formed to a body part that fixes a plurality of probes to a substrate part.

3. The test apparatus of a semiconductor device according to claim 2, wherein
   the body part comprises:
      a frame that at least one opening is formed; and
      at least two projected parts, the projected parts being formed integrally with the frame and placed in the opening, and
   the probe card mark is formed to the projected part.

4. The test apparatus according to claim 1, wherein the backing material marks are at least two electrode pads used at the time of a test process.

5. The test apparatus according to claim 1, wherein the backing marks are alignment marks formed to a place where a conductor pattern of the backing material is not formed.

6. The test apparatus according to claim 1, further comprising a display unit that displays a first line and a second line in order to enable visual comparison between the first and the second lines, the first line corresponding to the probe card mark connection line and indicating an orientation of the probe card, and the second line corresponding to the backing material mark connection line and indicating an orientation of the backing material.

7. A method of testing a semiconductor device comprising:
   recognizing positions of at least two probe card marks on a probe card using a probe card recognition device;
   recognizing an imaginary probe card mark connection line formed by connecting the positions of the at least two probe card marks using the probe card recognition device;
   recognizing positions of at least two backing material marks on a backing material mark using a backing material recognition device;
   recognizing an imaginary backing material mark connection line formed by connecting the positions of the at least two backing material marks using the backing material recognition device;
   recognizing a positional relationship between the probe card and the backing material according to the probe card mark connection line and the backing material mark connection line using a positional relationship recognition device; and correcting the position of at least one of the probe card and the backing material according to the positional relationship using a correction device.

8. The method according to claim 7, further comprising displaying a first line and a second line in order to enable visual comparison between the first and the second lines, the first line corresponding to the probe card mark connection line and indicating an orientation of the probe card, and the second line corresponding to the backing material mark connection line and indicating an orientation of the backing material.

* * * * *